United States Patent
Maehara et al.

[11] Patent Number: 5,834,977
[45] Date of Patent: Nov. 10, 1998

[54] AMPLIFYING CIRCUIT WITH POWER SUPPLY SWITCHING CIRCUIT

[75] Inventors: Eiju Maehara, Kiryu; Satoshi Sugimoto, Gunma, both of Japan

[73] Assignee: Sanyo Electric Co., Ltd., Osaka, Japan

[21] Appl. No.: 740,759

[22] Filed: Oct. 30, 1996

[30] Foreign Application Priority Data

Oct. 31, 1995 [JP] Japan ................................ 7-284055

[51] Int. Cl.⁶ ........................................................ H03F 3/20
[52] U.S. Cl. ............................................. 330/297; 330/273
[58] Field of Search .................................. 330/202, 267, 330/273, 297

[56] References Cited

U.S. PATENT DOCUMENTS 4,433,307  2/1984  Yokoyama ........................... 330/297
4,598,255  7/1986  Hong .................................... 330/297
5,450,037  9/1995  Kanaya et al. .

Primary Examiner—James B. Mullins
Attorney, Agent, or Firm—Loeb & Loeb LLP

[57] ABSTRACT

An amplifying circuit according to the present invention has an amplifying unit for amplifying an input signal to produce an amplified signal, a battery for generating a constant voltage (a first voltage), a step-up converter for always generating an increased voltage (or a second voltage) by increasing the constant voltage, and a selection changing circuit for supplying the increased voltage to the amplifying unit as an electric source voltage when a level of the amplified signal is higher than the constant voltage and supplying the constant voltage to the amplifying unit as the electric source voltage when a level of the amplified signal is lower than the constant voltage. Therefore, because the electric source voltage supplied to the amplifying unit is changed according to the level of the amplified signal, a loss occurring in an electric power consumed in the amplifying unit can be reduced. Also, because the increased voltage is always generated by the step-up converter as compared with a prior art in which any increased voltage is not always generated, even though the increased signal is a high frequency signal, the electric source voltage can reliably change with the level of the amplified signal, so that any distortion of the amplified signal can be prevented.

9 Claims, 6 Drawing Sheets

AMPLIFYING CIRCUIT WITH POWER SUPPLY SWITCHING CIRCUIT

BACKGROUND OF THE INVENTION

1. Field of the Invention

The present invention relates generally to an amplifying circuit, and more particularly to an amplifying circuit used for an on-vehicle type audio amplifier in which the amplifying efficiency is improved.

2. Description of the Prior Art

An amplifying circuit having a large output power has been recently required to use the amplifying circuit for an on-vehicle type audio amplifier, and an amplifying circuit having an output power as large as possible has been required on condition that the amplifying circuit be operated by using a battery as a sole electric source.

A first conventional amplifying circuit applied for an on-vehicle type audio amplifier system is described. As shown in FIG. 1, the first conventional amplifying circuit is composed of an on-vehicle type battery 31, a DC/DC converter 32, an amplifier 33 and a speaker SP.

In a simple on-vehicle type audio amplifier system, the battery 31 functions as an electric source. A voltage of the battery 31 normally ranges from 9 to 16 V, and a resistance of the speaker SP functioning as a load is normally 4 Ω. Therefore, assuming that the voltage generated by the battery 31 is directly used as an electric source of the amplifier 33 without using the DC/DC converter 32, an output power obtained in the amplifier 33 is almost 20 W at the most.

Therefore, in the first conventional amplifying circuit shown in FIG. 1, a constant voltage supplied from the battery 31 is increased by using the DC/DC converter 32, and the increased voltage is supplied to the amplifier 33 as a voltage of an electric source. In this case, because the electric source voltage supplied to the amplifier 33 becomes higher than the constant voltage generated by the battery 31, an output power of the amplifier 33 is larger than that in a case that the constant voltage of the battery 31 is directly supplied to the amplifier 33.

However, though the constant voltage of the battery 31 is always increased by the DC/DC converter 32 and the increased voltage is used as a voltage of an electric source, a converting efficiency in the DC/DC converter 32 is low and no more than almost 80%.

Also, because a high voltage is always supplied to the amplifier 33 even though no signal or a signal having a very low level is output from the amplifier 33, a loss of a consumed electric power with respect to an output power is enlarged, and there is a drawback that a total coefficient in the amplifier 33 is undesirably lowered.

To avoid this drawback, a second conventional amplifying circuit shown in FIG. 2 is proposed by inventors of the present invention. That is, the second conventional amplifying circuit is composed of a battery 41, a voltage increasing chopper 42, an amplifier 43, a bypass circuit 44, a comparator 45 and the speaker SP.

When the battery 41 is connected with the amplifier 43, a constant voltage of 12 V is supplied to the amplifier 43. In detail, because a switching circuit SW41 is set to an "off" condition, the voltage increasing chopper 42 is not operated, and the constant voltage +Vb of the battery 41 is supplied to the amplifier 43 through the bypass circuit 44. Therefore, an input signal AS input to the amplifier 43 is amplified by the amplifier 43, and an amplified signal ZS generated in the amplifier 43 is output from the amplifier 43 to the speaker SP.

In this case, a difference Va-ZS between an electric potential Va at a point A and an electric potential ZS of the amplified signal ZS is always detected by the comparator 45. In cases where a difference Vcc-ZS between a supplied voltage Vcc equal to the electric potential Va at the point A and the electric potential ZS of the amplified signal ZS is equal to or larger than a prescribed voltage of 5 V because a level of the amplified signal ZS is comparatively low, the operation of the switching circuit SW41 is stopped by the comparator 45 to set the switching circuit SW41 to the "off" condition, so that the constant voltage Vb of the battery 41 is supplied to the amplifier 43 through the bypass circuit 44, and the amplifier 43 is operated by using the constant voltage Vb of the battery 41 as an electric source voltage.

In contrast, in cases where a level of the amplified signal ZS is heightened the level of the amplified signal ZS approaches the electric potential Va at the point A. When the difference Vcc-ZS between the supplied voltage Vcc and the electric potential ZS becomes smaller than the prescribed voltage of 5 V, the operation of the switching circuit SW41 is started by the comparator 45 to set the switching circuit SW41 to an "on" condition. Therefore, the operation of the voltage increasing chopper 42 is started, the constant voltage Vb of the battery 41 is increased by the voltage increasing chopper 42, the supplied voltage Vcc equal to the electric potential Va at the point A is increased, and a high voltage generated by the voltage increasing chopper 42 is supplied to the amplifier 43.

Thereafter, when the difference Vcc-ZS becomes equal to or larger than the prescribed voltage of 5 V because the level of the amplified signal ZS is lowered, the operation of the switching circuit SW41 is stopped by the comparator 45, so that the constant voltage Vb of the battery 41 is supplied to the amplifier 43 through the bypass circuit 44, and the amplifier 43 is operated by using the constant voltage Vb of the battery 41.

Accordingly, assuming that a set of the comparator 45 and the voltage increasing chopper 42 is not arranged, when the level of the amplified signal ZS is heightened to make the difference Va-ZS between the electric potential Va at the point A and the electric potential ZS small, the amplified signal ZS is clipped and distorted to make the level of the amplified signal ZS higher than the constant voltage Vb. However, in the conventional amplifying circuit shown in FIG. 2, when the difference Va-ZS is lowered to a value lower than the prescribed voltage of 5 V, because the operation of the voltage increasing chopper 42 is started under the control of the comparator 45 to increase the electric potential Va at the point A and an electric source voltage for the amplifier 43 is heightened, the distortion of the output of the amplifier 43 can be prevented.

Also, in the first conventional amplifying circuit shown in FIG. 1, the DC/DC converter 32 functioning as a voltage increasing circuit at a low efficiency is always operated to supply the increased voltage to the amplifier 33. Therefore, an efficiency (or a ratio of an output electric power to a consumed electric power) in the first conventional amplifying circuit shown in FIG. 1 is lowered. However, in the second conventional amplifying circuit shown in FIG. 2, though the voltage increasing chopper 42 is operated at a low efficiency in the same manner, because the voltage increasing chopper 42 is not operated when the level of the amplified signal ZS is comparatively low but is operated when the amplified signal ZS having a high level is output from the amplifier 43, the efficiency in the second conventional amplifying circuit shown in FIG. 2 can be improved as compared with that in the first conventional amplifying circuit shown in FIG. 1.

Therefore, the second conventional amplifying circuit shown in FIG. 2 is tried to be used as parts of an on-vehicle hybrid IC. However, the increase of the electric source voltage supplied to the amplifier 43 is not always performed by the voltage increasing chopper 42. That is, the voltage increasing chopper 42 is not operated until the difference Va-ZS becomes lower than the prescribed voltage of 5 V but the operation of the voltage increasing chopper 42 is started to increase the electric source voltage supplied to the amplifier 43 when the difference Va-ZS becomes lower than the prescribed voltage of 5 V. Therefore, in cases where the amplified signal ZS is a high frequency signal having a frequency close to 20 kHz, the level of the amplified signal ZS is steeply changed, so that the operation of the voltage increasing chopper 42 cannot follow the steep change of the level of the amplified signal ZS. As a result, the level of the amplified signal ZS reaches the electric source voltage Vcc, so that there is a drawback that the output of the amplifier 43 is undesirably distorted.

Also, because a switching operation of the switching circuit SW41 is repeated at a high speed, in cases where an AM radio is, for example, operated in the neighborhood of the amplifying circuit, there is another drawback that an adverse influence of a switching noise is exerted on the AM radio.

SUMMARY OF THE INVENTION

A first object of the present invention is to provide, with due consideration to the drawbacks of such a conventional amplifying circuit, an amplifying circuit in which an electric source voltage following the change of a level of an amplified signal output from an amplifier is reliably supplied to the amplifier to prevent the distortion of an output of the amplifier while improving an efficiency of an electric power in the amplifier even though the level of the amplified signal is steeply changed.

A second object of the present invention is to provide an amplifying circuit in which any adverse influence of a switching noise is not exerted on an AM radio even though the AM radio is placed in the neighborhood of the amplifying circuit.

To achieve the first object, in an amplifying circuit according to the present invention, an increased voltage is generated by a voltage increasing circuit by always increasing a constant voltage. In cases where a level of an amplified signal output from an amplifying unit is equal to or higher than the constant voltage, the increased voltage is selected by a selection changing circuit and is supplied to the amplifying unit as an electric source voltage. Also, in cases where the level of the amplified signal is lower than the constant voltage, the constant voltage is selected by the selection changing circuit and is supplied to the amplifying unit as an electric source voltage. Therefore, assuming that the selection changing circuit is not operated even though the level of the amplified signal becomes equal to or higher than the constant voltage, an output of the amplifying unit is distorted because the level of the amplifying signal exceeds the constant voltage. However, because the increased voltage is always generated by the voltage increasing circuit, the increased voltage can be supplied to the amplifying unit as an electric source voltage by the selection changing circuit, so that the distortion of the output of the amplifying unit can be suppressed.

Also, though the voltage increasing circuit is always operated, any load is not connected to the voltage increasing circuit when the increased voltage generated in the voltage increasing circuit is not selected by the selection changing circuit, a consumed electric power in the voltage increasing circuit is almost zero, an efficient in the amplifying circuit is not lowered by the operation of the voltage increasing circuit, so that the efficiency (or a ratio of an output electric power to a consumed electric power) can be improved as compared with that in a conventional AB-class amplifying circuit.

Also, the increased voltage is generated by always operating the voltage increasing circuit, the increased voltage generated in the voltage increasing circuit is quickly selected by the selection changing circuit when the increased voltage is required, and the increased voltage is supplied to the amplifying unit as an electric source voltage. Therefore, even though the level of the amplifying signal is changed at a high frequency, the supply of the increased voltage to the amplifying unit can sufficiently follow the change of the level of the amplified signal. Accordingly, the distortion of the output of the amplified signal which occurs in the conventional amplifying circuit in cases where the level of the amplifying signal is changed at a high frequency can be suppressed.

Here, the amplifying unit in the amplifying circuit according to the present invention is formed of a high efficient type amplifier comprising a signal amplifying unit for generating the amplified signal by amplifying an input signal, and a supplementary electric source unit for generating a changeable voltage following the change of the level of the amplified signal by using an electric source voltage and setting the changeable voltage to an electric source voltage of the signal amplifying unit.

Because the changeable voltage is supplied to the signal amplifying unit as the electric source voltage according to the level of the amplified signal in the high efficient type amplifier, the electric source voltage having a high level is supplied to the signal amplifying unit when the amplified signal is a high level, and the electric source voltage having a low level is supplied to the signal amplifying unit when the amplified signal is a low level. Therefore, though a loss of the consumed electric power in a general amplifier occurs in cases where a voltage of a high level is supplied to the general amplifier as an electric source voltage when a signal of a low level is input to the general amplifier, the loss of the consumed electric power can be suppressed in the high efficient type amplifier. Accordingly, the efficiency in the high efficient type amplifier can be heightened as compared with that in the normal amplifier in which a constant voltage is supplied as an electric source voltage.

Also, the selection changing circuit of the amplifying circuit according to the present invention further comprises a switching device arranged between the voltage increasing circuit and the amplifying circuit. A reference voltage lower than the constant voltage is compared with the amplified signal in the selection changing circuit. Thereafter, in cases where the level of the amplified signal is equal to or higher than the reference voltage, the switching device is set to an "on" condition, and the increased voltage generated in the voltage increasing circuit is supplied to the amplifying unit as an electric source voltage. In contrast, in cases where the level of the amplified signal is lower than the reference voltage, the switching device is set to an "off" condition, and the constant voltage is supplied to the amplifying unit through a bypass circuit as an electric source voltage.

Assuming that the constant voltage is merely compared with the level of the amplified signal in the selection changing circuit, in cases where the level of the amplified signal is steeply heightened, the amplifying circuit cannot follow the steep change of the level of the amplified signal, the level of the amplified signal reaches the constant voltage when the level of the amplified signal is about to exceed the constant voltage, and the amplified signals is distorted.

However, in the present invention, the reference voltage lower than the constant voltage is compared with the level of the amplified signal in the selection changing circuit, and the selection of the constant voltage of the bypass circuit or the increased voltage generated in the voltage increasing circuit is performed in the selection changing circuit according to a high or low relationship between the reference voltage and the level of the amplified signal. Therefore, even though the level of the amplified signal is steeply changed, the increased voltage generated in the voltage increasing circuit is selected when the level of the amplified signal exceeds the reference voltage before the level of the amplified signal reaches the constant voltage, and the increased voltage is supplied to the amplifying unit as an electric source voltage. Accordingly, the distortion of the amplified signal can be prevented.

To achieve the second object, the amplifying circuit according to the present invention further comprises a microcomputer for stopping the operation of the voltage increasing circuit and controlling signals of the amplifying circuit in a lump in cases where an AM radio is operated in the neighborhood of the voltage increasing circuit having an amplifier or the switching device. In cases where the voltage increasing circuit has the switching device, a problem that a switching noise is mixed with a radio signal received by the AM radio as a noise can be suppressed.

DESCRIPTION OF THE PREFERRED EMBODIMENTS

Preferred embodiments of an amplifying circuit according to the present invention are described with reference to drawings.

(First Embodiment)

Figure 3:
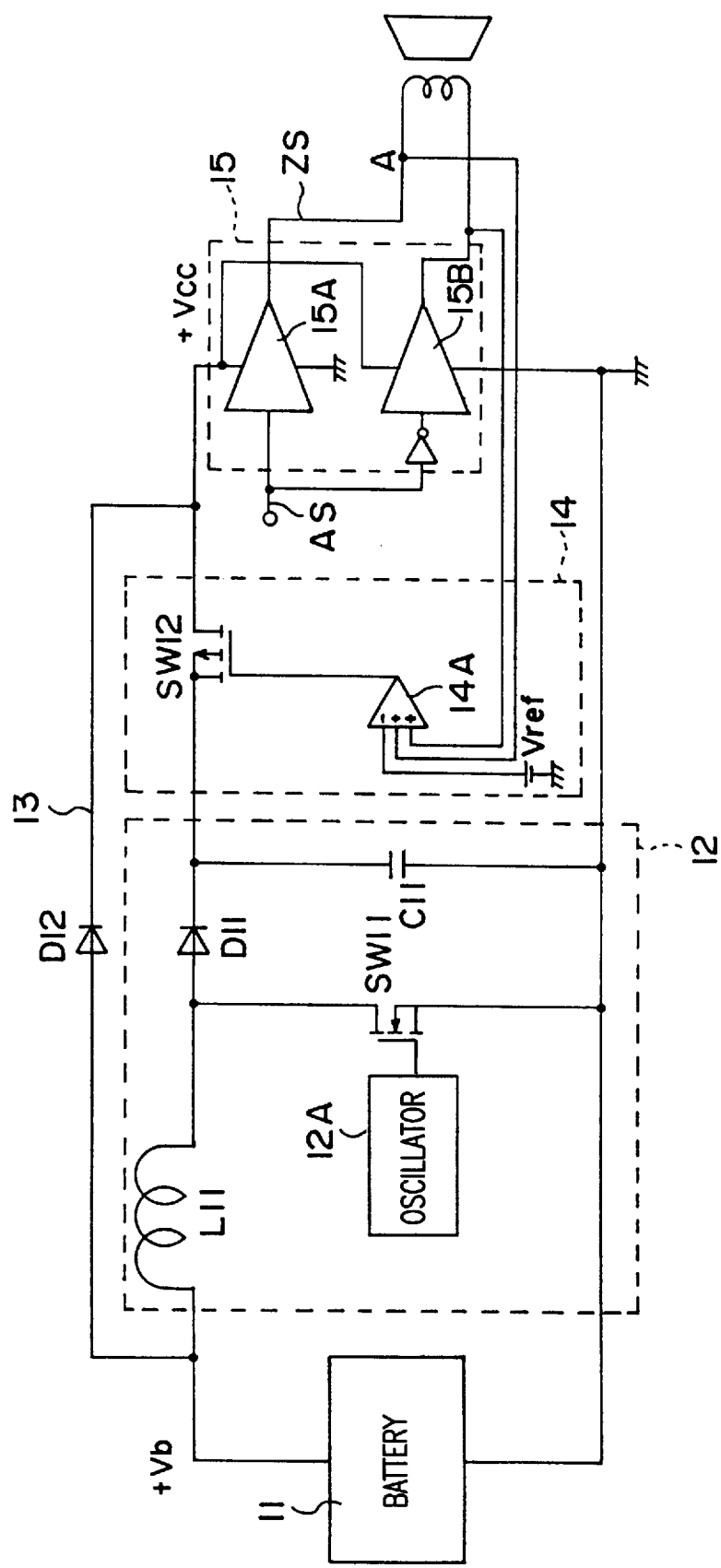
FIG. 3 is a circuit view of an amplifying circuit according to a first embodiment of the present invention.

As shown in FIG. 3, an on-vehicle type audio amplifying circuit according to a first embodiment of the present invention comprises a battery 11, a step-up converter 12, a bypass circuit 13, a switching circuit 14, an amplifier unit 15 and a speaker SP.

The battery 11 is an example of an electric source, and a constant voltage +Vb of 12 V is generated as an example of a first voltage.

The step-up converter 12 is an example of the voltage increasing circuit, and the step-up converter 12 comprises a coil L11, a diode D11, a condenser C11, an oscillator 12A and a switching transistor SW11. An ON/OFF operation is repeatedly performed by the switching transistor SW11 under the control of the oscillator 12A, the constant voltage +Vb generated in the battery 11 is increased according to a duty ratio of the ON/OFF operation, and an increased voltage of 18 V is always generated as an example of a second voltage.

The bypass circuit 13 is formed of a diode D12 connected with the step-up converter 12 in parallel. The constant voltage Vb is supplied to the amplifying unit 15 through the bypass circuit 13.

The switching circuit 14 is an example of the selection changing circuit. The switching circuit 14 comprises a comparator 14A and a switching transistor SW12. A level of an amplifying signal ZS and an output voltage of the amplifying unit 15 equal to an electric potential Va at a point A are always detected by the switching circuit 14. When the electric potential Va becomes lower than a reference voltage Vref lower than the constant voltage +Vb, the switching transistor SW12 is set to an "off" condition to select the constant voltage +Vb of the bypass circuit 13. In contrast, when the electric potential Va becomes equal to or higher than the reference voltage Vref, the switching transistor SW12 is set to an "on" condition to select the increased voltage of the step-up converter 12.

The amplifying unit 15 is an example of the amplifying unit. An input signal AS input to the amplifying unit 15 is amplified to generate the amplified signal ZS, and the amplified signal ZS is output to the speaker SP having a load of 4 Ω. The amplifying unit 15 comprises a pair of amplifiers 15A and 15B connected with each other in a balanced transformerless (BTL).

In the above configuration, an operation of the amplifying circuit is described.

When an operation of the amplifying circuit is started, the constant voltage +Vb of 12 V is supplied from the battery 11 to the amplifying unit 15. Thereafter, the step-up converter 12 is operated by operating the oscillator 12A and performing an on/off operation in the switching transistor SW11, and the increased voltage of about 18 V is generated from the constant voltage +Vb.

At this time, the switching transistor SW12 is set to the "off" condition, the constant voltage +Vb of 12 V is supplied from the battery 11 to the amplifying unit 15 through the bypass circuit 13, the input signal AS is amplified by using the constant voltage +Vb, and the amplified signal ZS is generated in the amplifying unit 15 and is transmitted to the speaker SP.

During the operation of the amplifying circuit, the electric potential Va at the point A is always compared with the reference voltage Vref by the comparator 14A, and the switching transistor SW12 is set to the "on" or "off" condition according to a high or low relationship of the electric potential Va and the reference voltage Vref. In this case, the reference voltage Vref is set to 10 V.

In detail, in cases where the level of the amplified signal ZS is comparatively low and the electric potential Va is lower than the reference voltage Vref of 10 V, an output of the comparator 14A is set to a low level "L", the switching transistor SW12 is set to the "off" condition according to the output of the comparator 14A, and the constant voltage +Vb is supplied to the amplifying unit 15 through the bypass circuit 12. During the supply of the constant voltage +Vb to the amplifying unit 15 through the bypass circuit 12, the step-up converter 12 is operated, and the increased voltage of 18 V is generated. However, because the switching transistor SW12 is set to the "off" condition, any load is not connected with the step-up converter 12, so that an electric power consumed in the step-up converter 12 is almost zero. Therefore, even though the increased voltage is always generated in the step-up converter 12, there is no probability that an efficiency in the entire amplifying circuit is lowered. Here the efficiency in the entire amplifying circuit denotes a ratio of an electric power output from the speaker SP to an electric power consumed in the amplifying circuit.

Thereafter, when the level of the amplified signal ZS becomes high and the electric potential Va becomes equal to or higher than the reference voltage Vref of 10 V, an output of the comparator 14A is set to a high level "H", the switching transistor SW12 is set to the "on" condition according to the output of the comparator 14A, and the increased voltage of about 18 V obtained in the step-up converter 12 is supplied to the amplifying unit 15.

Thereafter, when the level of the amplified signal ZS becomes again low and the electric potential Va becomes lower than the reference voltage Vref, the output of the comparator 14A is again set to "L", the switching transistor SW12 is again set to the "off" condition according to the output of the comparator 14A, and the electric source voltage +Vcc supplied to the amplifying unit 15 is again set to the constant voltage +Vb supplied through the bypass circuit 12.

Figure 4:
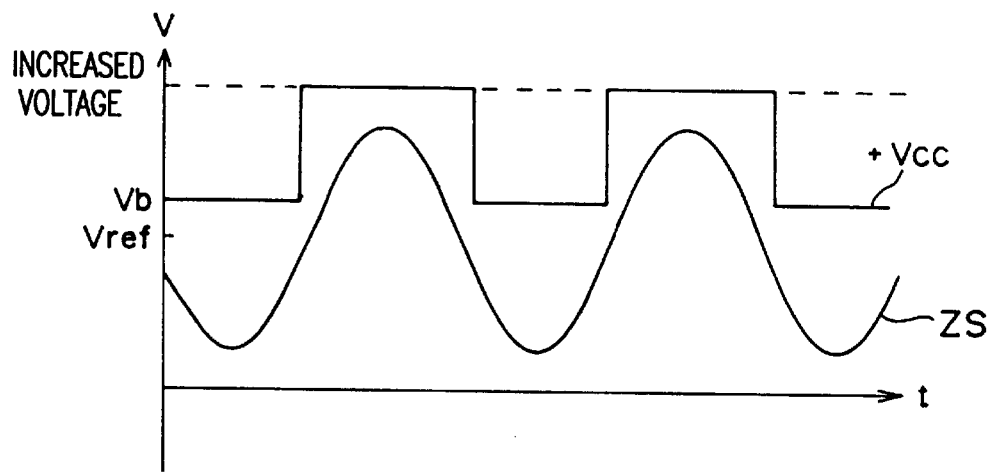
FIG. 4 is a view showing an operation of the amplifying circuit according to the first embodiment of the present invention.

Therefore, even though the level of the input signal AS is changed at a high frequency, as shown in FIG. 4, because the electric source voltage +Vcc changing with the level of the amplified signal ZS is supplied to the amplifying unit 15, the amplified signal ZS of which the level is changed at the high frequency can be stably obtained.

Accordingly, assuming that the constant voltage +Vb of about 12 V is always supplied to the amplifying unit 15 regardless of the change of the level of the input signal AS (or the amplified signal ZS), the amplified signal ZS is undesirably clipped when the level of the amplified signal ZS reaches or exceeds the constant voltage +Vb. However, in this embodiment, when the electric potential Va exceeds the reference voltage Vref of 10 V, because the switching transistor SW12 is set to the "on" condition by the comparator 14A to select the increased voltage always generated by the step-up converter 12, the increased voltage is supplied to the amplifying unit 15, so that the distortion of the amplified signal ZS can be prevented.

Also, even though the level of the input signal AS (or the amplified signal) is, for example, steeply heightened, because the increased voltage is rapidly selected by the comparator 14A when the electric potential Va exceeds the reference voltage Vref lower than the constant voltage +Vb, the increased voltage can be reliably supplied to the amplifying unit 15 before the level of the amplified signal ZS reaches the constant voltage +Vb. Accordingly, even though the level of the input signal AS (or the amplified signal) is steeply changed, the distortion of the amplified signal ZS can be reliably prevented.

Figure 1:
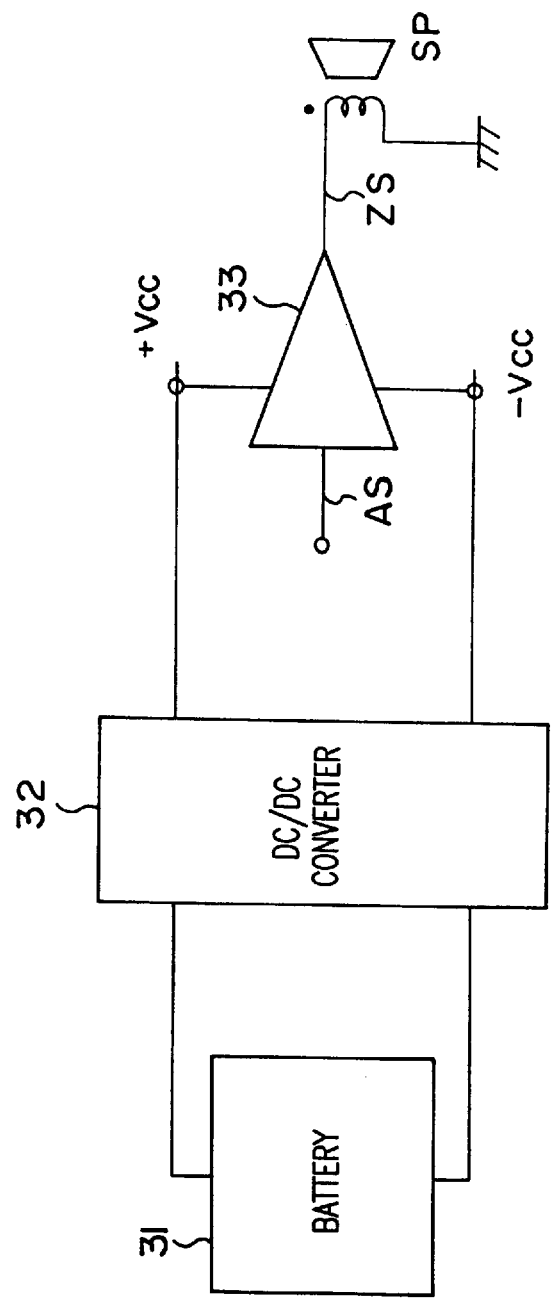
FIG. 1 is a circuit view of a first conventional amplifying circuit applied for an on-vehicle type audio amplifier system.
Figure 5:
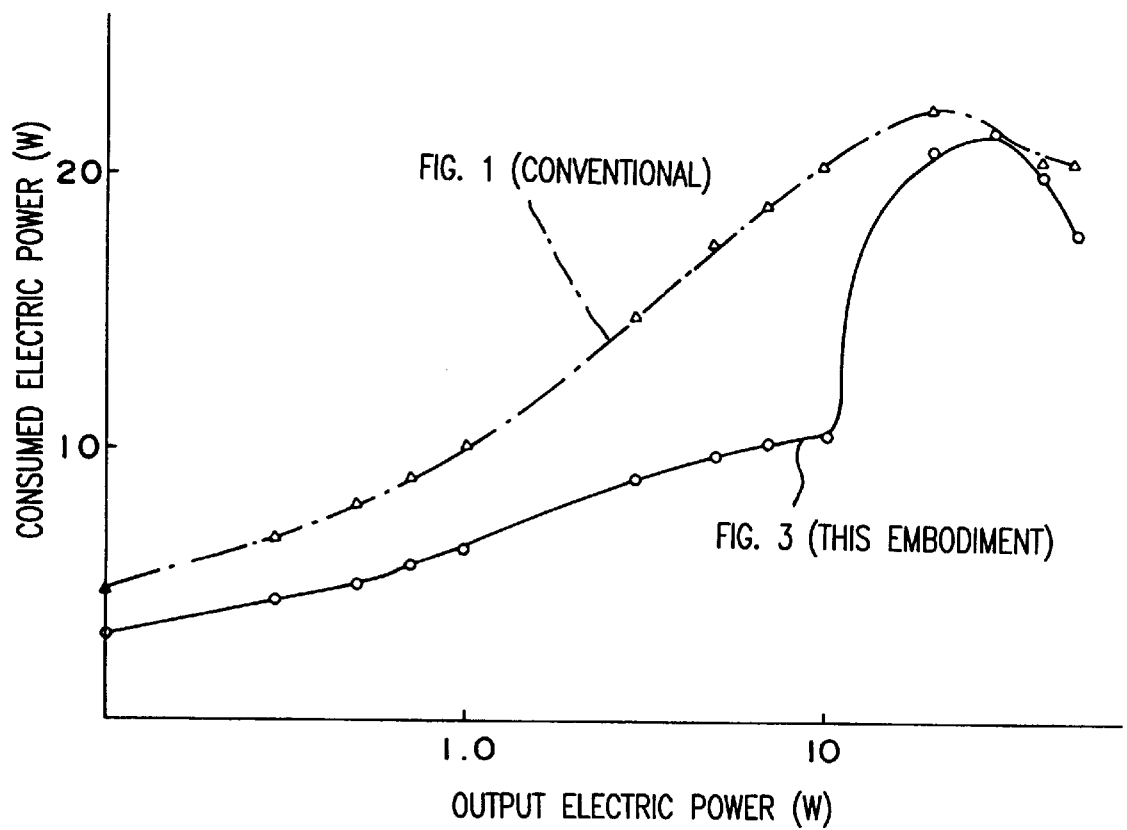
FIG. 5 is a graphic view showing an effect of the amplifying circuit according to the first embodiment of the present invention.

Also, though the step-up converter 12 is always operated, because the switching transistor SW12 is set to the "off" condition by the comparator 14A to supply the constant voltage +Vb to the amplifying unit 15 when the level of the amplified signal ZS is low, any load is not connected with the step-up converter 12. Accordingly, an electric power consumed in the step-up converter 12 becomes almost zero, an efficiency (a ratio of an electric power output from the speaker SP to an electric power consumed in the amplifying circuit) in the entire amplifying circuit is not lowered even though the increased voltage is always generated in the step-up converter 12. Therefore, as shown in FIG. 5, the efficiency can be improved as compared with that in an amplifying circuit shown in FIG. 1. That is, a relationship between a consumed electric power and an output electric power for the amplifying circuit according to this embodiment and the amplifying circuit shown in FIG. 1 is shown in FIG. 5. As is realized in this relationship, a consumed electric power in the amplifying circuit according to this embodiment is lower than that in the amplifying circuit shown in FIG. 1 in an output electric power range from 1 to 10 W usually used.

Figure 2:
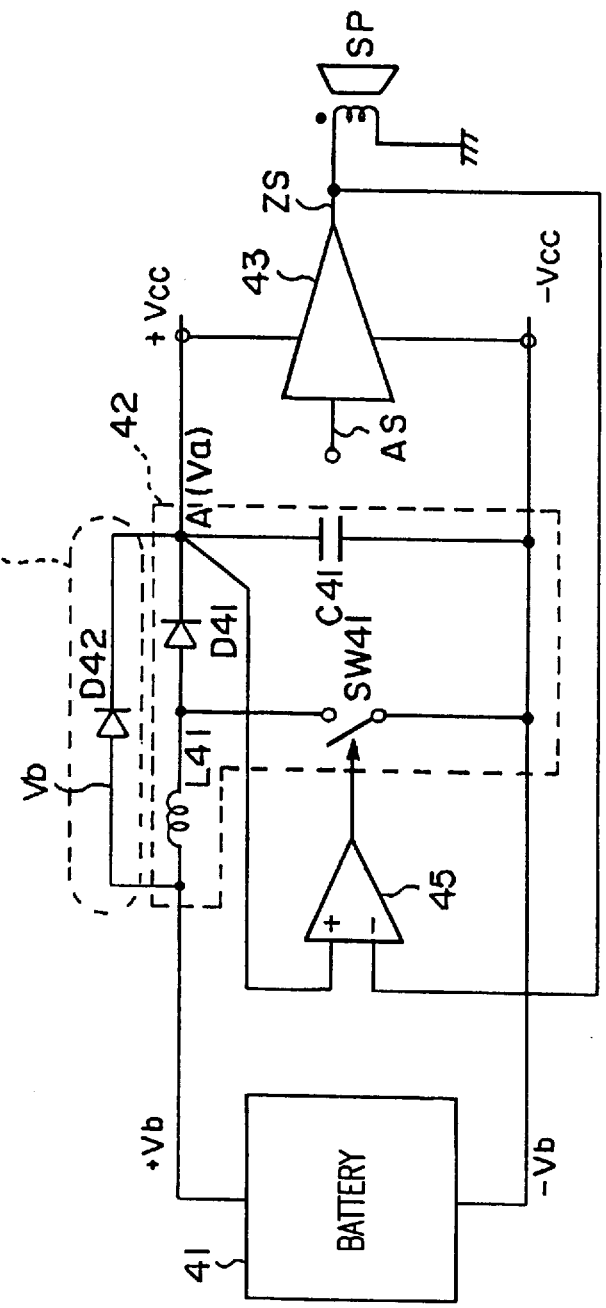
FIG. 2 is a circuit view of a second conventional amplifying circuit applied for the on-vehicle type audio amplifier system.

In addition, because the increased voltage of about 18 V is generated by always operating the step-up converter 12 and the increased voltage is supplied to the amplifying unit 15 by selecting the increased voltage in the switching circuit 14 when the increased voltage is required, the electric source voltage Vcc sufficiently following the change of the level of the amplified signal ZS can be always supplied to the amplifying unit 15. Therefore, though an output distortion occurs in the amplified signal ZS obtained in the conventional amplifying circuit shown in FIG. 2 because the operation of the step-up converter 44 cannot follow the change of the level of the amplifying signal ZS in cases where the amplifying signal ZS is a high frequency signal, any distortion of the amplified signal ZS can be prevented in this embodiment.

In this embodiment, a case that the amplifying circuit is applied for an on-vehicle type audio amplifier system is described. The reason that the amplifying circuit is applied for the on-vehicle type audio amplifier system is as follows. In the on-vehicle type audio amplifier system, an electric source is limited to a battery, and a maximum output power of the battery is limited. In this case, because the amplifying circuit is necessary to obtain a large output power exceeding the maximum output power of the battery, the effect obtained in this embodiment is great in cases where the amplifying circuit is applied for the on-vehicle type audio amplifier system. However, this embodiment is not limited to the on-vehicle type audio amplifier system. That is, it is applicable that the amplifying circuit be applied for a system in which a constant voltage generated in a single electric source is increased to obtain a large output power.

Also, in this embodiment, the two amplifiers 15A and 15B are connected with each other in the balanced transformer-less (BTL). However, this embodiment is not limited to the balanced transformerless. For example, it is applicable that a single large output power type amplifier be used as the amplifying unit 15.

(Second Embodiment)

Hereinafter, an amplifying circuit according to a second embodiment of the present invention is described. The description which is the same as in the first embodiment is omitted in the second embodiment.

The difference in the second embodiment from the first embodiment is that a high efficiency amplifier is used as the amplifying unit 15, and the other constitutional elements in the amplifying circuit in the second embodiment are the same as those in the first embodiment. Therefore, the configuration and operation of the high efficiency amplifier are described in detail.

Figure 6:
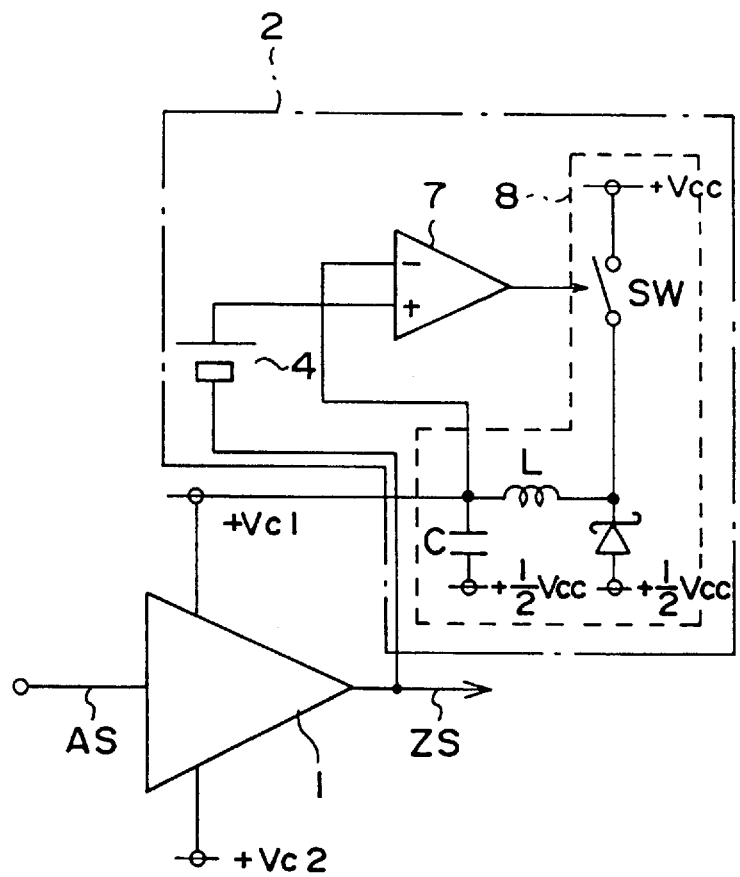
FIG. 6 is a circuit view of a high efficiency amplifier according to a second embodiment of the present invention.

As shown in FIG. 6, the high efficiency amplifier comprises an amplifier 1 which is an example of the signal amplifying unit, and a supplementary electric source unit 2.

In the amplifier 1, an input signal AS is amplified by using an electric source voltage +Vc described later, and an amplified signal ZS is output. Therefore, the amplifier 1 comprises a voltage amplifying unit (not shown) for amplifying a voltage of the input signal AS, and a current amplifying unit (not shown) for amplifying an output current of the voltage amplifying unit.

The supplementary electric source unit 2 comprises an offset voltage generating circuit 4, a comparator 7 and a chopper electric source 8. In the supplementary electric source unit 2, the electric source voltage +Vcc supplied from the bypass circuit 13 or the step-up converter 12 shown in FIG. 3 is changed according to the increase and decrease of the level of the amplified signal ZS, the electric source voltage +Vcc is decreased by a combined circuit of a coil L and a condenser C to generate a decreased voltage, and the decreased voltage is supplied to the amplifier 1 as the electric source voltage +Vc1 (an example of a third voltage). That is, the level of the amplified signal ZS is heightened by an offset voltage generated by the offset voltage generating circuit 4 to generate the electric source voltage +Vc1 which has a positive level and changes with the level of the amplified signal ZS, and the electric source voltage +Vc1 is supplied to the amplifier 1 through a high electric source line.

Also, another supplementary electric source unit (not shown) having the same configuration as the supplementary electric source unit 2 is connected with a low electric source line of the amplifier 1 in symmetry to the unit 2. Because an operation performed in the supplementary electric source unit (not shown) is the same as that performed in the supplementary electric source unit 2, the description of the operation in the supplementary electric source unit (not shown) is omitted.

An operation performed in the high efficiency amplifier is described.

The electric source voltage +Vcc supplied from the bypass circuit 13 or the step-up converter 12 is initially applied to the supplementary electric source unit 2. Thereafter, the input signal AS is amplified by the amplifier 1 to generate the amplified signal ZS, the amplified signal ZS is output to both the speaker SP and the offset voltage generating circuit 4 of the supplementary electric source unit 2. In the offset voltage generating circuit 4, the level of the amplified signal ZS is heightened by a constant offset voltage to generate an offset signal of which a level is always higher than that of the amplified signal ZS by the constant offset voltage, and the offset signal is input to a non-inverted input plus-terminal of the comparator 7. Also, the electric source voltage +Vc1 output from the chopper electric source 8 is input to an inverted input minus-terminal of the comparator 7, and the level of the offset signal is always compared with the electric source voltage +Vc1 in the comparator 7.

An output line of the comparator 7 is connected with a switching circuit SW of the chopper electric source 8. Therefore, in cases where the level of the offset signal is higher than the electric source voltage +Vc1, an output of the comparator 7 is set to a high level "H", the switching circuit SW is set to an "on" condition, the electric source voltage +Vcc is applied to the high electric source voltage line of the amplifier 1 through the switching circuit SW while reducing the electric source voltage +Vcc in the combined circuit of the coil L and the condenser C, and the electric source voltage +Vc1 applied to the amplifier 1 is increased. In contrast, in cases where the level of the offset signal becomes lower than the electric source voltage +Vc1, the output of the comparator 7 is set to a low level "L", the switching circuit SW is set to an "off" condition, the supply of the electric source voltage +Vcc to the high electric source voltage line of the amplifier 1 is stopped, an electric power of the high electric source voltage line of the amplifier 1 is discharged through the condenser C, and the electric source voltage +Vc1 applied to the amplifier 1 is decreased. Also, because an electric voltage at one side of the condenser C is maintained to ½ Vcc, a minimum value of the electric source voltage +Vc1 applied to the amplifier 1 is set to ½ Vcc+(constant offset voltage).

Figure 7:
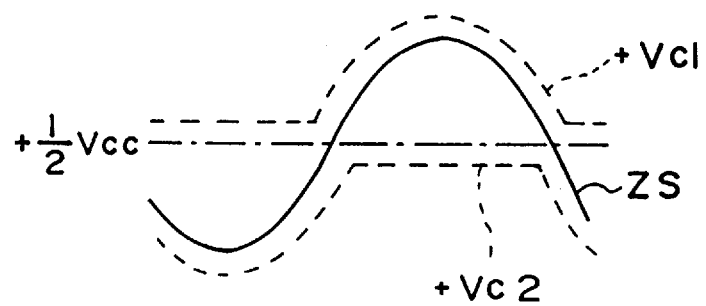
FIG. 7 is a view showing an operation of the high efficiency amplifier according to the second embodiment of the present invention.

Therefore, as shown in FIG. 7, when the amplified signal ZS is set to a high level (or an upper side level), the electric source voltage +Vc1 is applied to the amplifier 1 while the electric source voltage +Vc1 changes with the level of the amplified signal ZS on condition that the electric source voltage +Vc1 is always higher than that of the amplified signal ZS by the constant offset voltage, the input signal AS is amplified in the amplifier 1 by using the electric source voltage +Vc1, and the amplified signal ZS is output to the speaker SP.

As is described above, as shown in FIG. 7, even though the increased voltage generated in the step-up converter 12 is selected by the switching circuit 14 because the amplified signal ZS is set to the high level, when the level of the amplified signal ZS is decreased because the level of the input signal AS input to the amplifier 1 is decreased, the level of the offset signal is decreased, so that the level of the offset signal becomes lower than the electric source voltage +Vc1. Therefore, the electric source voltage +Vc1 is lowered. In contrast, when the level of the amplified signal ZS is increased because the level of the input signal AS input to the amplifier 1 is increased, the level of the offset signal is increased, so that the level of the offset signal becomes higher than the electric source voltage +Vc1. Therefore, the electric source voltage +Vc1 is heightened.

Accordingly, when the increased voltage generated in the step-up converter 12 is selected as the electric source voltage +Vcc by the switching circuit 14, because the increased voltage having a constant high electric level is always supplied to the amplifying unit 15 in the first embodiment even though the level of the amplified signal ZS is considerably lower than the increased voltage, an electric power is wastefully consumed in the amplifiers 15A and 15B of the first embodiment. However, in the second embodiment, when the increased voltage generated in the step-up converter 12 is selected as the electric source voltage +Vcc by the switching circuit 14, because the electric source voltage +Vc1 changes with the level of the amplified signal ZS, a difference between the electric source voltage +Vc1 and the level of the amplified signal ZS is maintained to the constant offset voltage. Therefore, a loss of the electric power consumed in the amplifier 1 can be suppressed when the increased voltage generated in the step-up converter 12 is selected as the electric source voltage +Vcc.

In the same manner, because the supplementary electric source unit (not shown) is connected with the low electric source line of the amplifier 1, when the constant voltage +Vb is selected as the electric source voltage +Vcc by the switching circuit 14, another electric source voltage +Vc2 applied to the amplifier 1 through the low electric source line changes with the level of the amplified signal ZS, a difference between the electric source voltage +Vc2 and the level of the amplified signal ZS is maintained to the constant offset voltage. Therefore, a loss of the electric power consumed in the amplifier 1 can be suppressed when the constant voltage +Vb is selected as the electric source voltage +Vcc.

Therefore, because the high efficiency amplifier shown in FIG. 6 is used as the amplifying unit 15 of the amplifying circuit shown in FIG. 3, the efficiency can be moreover improved as compared with that in the first embodiment in which a constant voltage is used as the electric source voltage for the amplifying unit 15.

In the second embodiment, the high efficiency amplifier having the configuration shown in FIG. 6 is described. However, the second embodiment is not limited to the amplifying circuit having the high efficiency amplifier. That is, any amplifying unit can be useful on condition that the amplifying unit is operated by using an electric source voltage which is always higher than the level of the amplifying signal ZS by a constant voltage.

Also, the high efficiency amplifier is composed of the single amplifier 1. However, it is applicable that the high efficiency amplifier comprises a pair of amplifiers connected with each other in the balanced transformerless (BTL).

(Third Embodiment)

Hereinafter, an amplifying circuit according to a third embodiment of the present invention is described with reference to FIG. 8. The description which is the same as in the first or second embodiment is omitted in the third embodiment.

Figure 8:
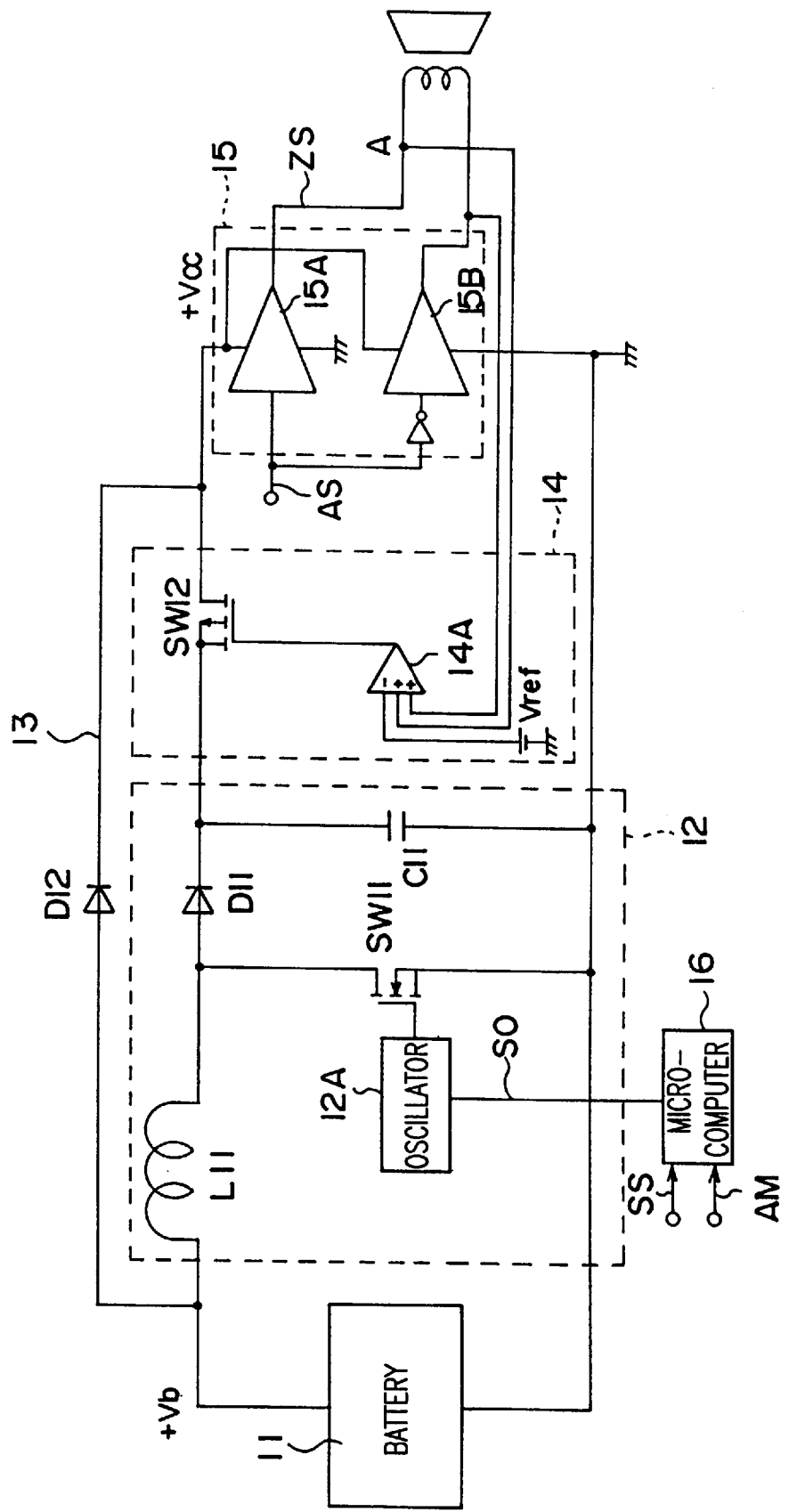
FIG. 8 is a circuit view of an amplifying circuit according to a third embodiment of the present invention.

As shown in FIG. 8, an on-vehicle type audio amplifying circuit according to a third embodiment of the present invention comprises the battery 11, the step-up converter 12, the bypass circuit 13, the switching circuit 14, the amplifier unit 15, a microcomputer 16 and the speaker SP.

The difference of the configuration of the amplifying circuit according to the third embodiment from that according to the first embodiment is that the microcomputer 16 is connected with the oscillator 12A, and the function and operation in other constitutional elements according to the third embodiment are the almost the same as those according to the first embodiment. Therefore, the function and operation in the other constitutional elements are omitted.

The microcomputer 16 is a circuit for controlling the amplifying circuit according to the third embodiment, all signals which are input to an operational panel operated by an external operator or are transmitted from another external device are input to the microcomputer 16, various control signals are generated in the microcomputer 16 according to the signals, and the control signals are output to various constitutional elements of the amplifying circuit to control the constitutional elements.

In this embodiment, a function for controlling the step-up converter 12 according to an AM radio operating signal AM indicating the operation of an AM radio in the neighborhood of the amplifying circuit is added to the microcomputer 16, and the amplifying circuit having this function is a feature in the third embodiment.

The operation of the amplifying circuit according to the third embodiment is described. The feature of the amplifying circuit is displayed when an AM radio is operated in the neighborhood of the amplifying circuit, and the operation of the amplifying circuit in a normal condition in which any AM radio is not operated in the neighborhood of the amplifying circuit is the same as that in the first embodiment. Therefore, the description of the operation of the amplifying circuit in the normal condition is omitted.

Hereinafter, the operation of the amplifying circuit in a particular condition in which an AM radio is operated in the neighborhood of the amplifying circuit is described. A tuner, an amplifier, a CD player and the like in an on-vehicle audio system are arranged in a unit, and a microcomputer for controlling operations of the tuner, the amplifier, the CD player and the like is arranged in the on-vehicle audio system, so that an operation of each device in the on-vehicle audio system is controlled by the microcomputer. Therefore, in cases where the on-vehicle audio system is made up, though any microcomputer is not shown in the first or second embodiment, the microcomputer is necessary for the on-vehicle audio system.

In this system, because the amplifying unit 15 is placed in the neighborhood of an AM radio tuner, when an AM radio broadcasting signal is received by the on-vehicle audio system, a switching noise of the switching transistor SW11 is mixed with the AM radio broadcasting signal, so that there is a drawback in the prior art that the switching noise is output as a noise from the speaker SP of the AM radio. In particular, because a frequency band for the AM radio is close to a switching frequency of the switching transistor SW11, the switching noise is remarkably output.

To solve the above drawback, in the amplifying circuit according to the third embodiment, in cases where an AM radio is operated, an AM radio operating signal AM indicating the operation of the AM radio is input to the microcomputer 16. When the AM radio operating signal AM is detected by the microcomputer 16, an operation stopping signal S0 is output from the microcomputer 16 to the oscillator 12A, and the operation of the oscillator 12A is stopped. Because the operation of the oscillator 12A is stopped, the switching transistor SW11 is turned off, and the operation of the step-up converter 12 is stopped during the operation of the AM radio. Therefore, the constant voltage +Vb is always supplied to the amplifying unit 15 through the bypass circuit 13.

Accordingly, any on/off operation is not performed in the switching transistor SW11 during the operation of the AM radio, there is no probability that a switching noise is mixed with the AM radio broadcasting signal and a noise is output from the speaker SP. In this case, because the electric source voltage supplied to the amplifying unit 15 is the constant voltage +Vb lower than the increased voltage, there is a case that the amplified signal ZS is distorted when a level of the amplified signal ZS is high. However, because a quality of a sound obtained from the amplified signal ZS in the speaker SP of the AM radio is originally not superior, even though the amplified signal ZS is distorted, the sound quality is not degraded so much.

In this embodiment, the AM radio operating signal AM is detected by the microcomputer 16. However, the detection of the signal AM is not limited to the microcomputer 16.

Also, the on/off operation in the switching transistor SW11 is stopped by stopping the operation of the oscillator 12A under the control of the microcomputer 16. However, the present invention is not limited to the use of the microcomputer 16. That is, it is applicable that the on/off operation in the switching transistor SW11 be stopped by a certain device.

And, the present invention should not be restricted to the numeral values (12 V, 18 V, 10 V etc.)described in the embodiments.

What is claimed is:

1. An amplifying circuit comprising:

an amplifying unit for amplifying an input signal, thus generating an amplified signal;

an electric source for generating a first voltage;

a bypass circuit arranged between the electric source and the amplifying unit for supplying the first voltage generated by the electric source to the amplifying unit;

a voltage increasing circuit arranged in parallel to the bypass circuit for always increasing the first voltage generated by the electric source, thus generating a second voltage; and a selection changing circuit for supplying the second voltage generated by the voltage increasing circuit to the amplifying unit in cases where a level of the amplified signal output from the amplifying unit is higher than the first voltage generated by the electric source and supplying the first voltage to the amplifying unit in cases where the level of the amplified signal is lower than the first voltage, wherein the amplifying unit includes a supplementary electric source unit for generating a third voltage changing with the level of the amplified signal from the first voltage generated by the electric source or the second voltage generated by the voltage increasing circuit and supplying the third voltage to the amplifying unit as an electric source voltage for the amplifying unit.

2. An amplifying circuit according to claim 1 in which the selection changing circuit comprises:

a comparator for comparing a reference voltage lower than the first voltage with the level of the amplified signal; and a switching element arranged between the voltage increasing circuit and the amplifying unit for setting to an "on" condition to supply the second voltage to the amplifying unit in cases where the level of the amplified signal is higher than the reference voltage as a result of the comparison performed by the comparator and setting to an "off" condition to supply the first voltage to the amplifying unit in cases where the level of the amplified signal is lower than the reference voltage as a result of the comparison performed by the comparator.

3. An amplifying circuit comprising:

an amplifying unit for amplifying an input signal, thus generating an amplified signal;

an electric source for generating a first voltage;

a bypass circuit arranged between the electric source and the amplifying unit for supplying the first voltage generated by the electric source to the amplifying unit;

a voltage increasing circuit arranged in parallel to the bypass circuit for always increasing the first voltage generated by the electric source, thus generating a second voltage; and a selection changing circuit for supplying the second voltage generated by the voltage increasing circuit to the amplifying unit in cases where a level of the amplified signal output from the amplifying unit is higher than the first voltage generated by the electric source and supplying the first voltage to the amplifying unit in cases where the level of the amplified signal is lower than the first voltage, wherein the voltage increasing circuit is a step-up converter having a switching element for repeating an ON/OFF operation and increasing the first voltage according to a duty ratio of the ON/OFF operation; and an oscillator for controlling the ON/OFF operation of the switching element.

4. An amplifying circuit according to claim 3 in which the electric source is a battery used for an on-vehicle type system.

5. An amplifying circuit according to claim 3 in which the selection changing circuit comprises:

a comparator for comparing a reference voltage lower than the first voltage with the level of the amplified signal; and a switching element arranged between the voltage increasing circuit and the amplifying unit for setting to an "on" condition to supply the second voltage to the amplifying unit in cases where the level of the amplified signal is higher than the reference voltage as a result of the comparison performed by the comparator and setting to an "off" condition to supply the first voltage to the amplifying unit in cases where the level of the amplified signal is lower than the reference voltage as a result of the comparison performed by the comparator.

6. An amplifying circuit comprising:

an amplifying unit for amplifying an input signal, thus generating an amplified signal;

an electric source for generating a first voltage;

a bypass circuit arranged between the electric source and the amplifying unit for supplying the first voltage generated by the electric source to the amplifying unit;

a voltage increasing circuit arranged in parallel to the bypass circuit for always increasing the first voltage generated by the electric source, thus generating a second voltage;

a selection changing circuit for supplying the second voltage generated by the voltage increasing circuit to the amplifying unit in cases where a level of the amplified signal output from the amplifying unit is higher than the first voltage generated by the electric source and supplying the first voltage to the amplifying unit in cases where the level of the amplified signal is lower than the first voltage; and a microcomputer for stopping the operation of the voltage increasing circuit in cases where an AM radio is operated in the neighborhood of the amplifying unit or the voltage increasing circuit, and for controlling signals in the amplifying circuit.

7. An amplifying circuit according to claim 6 in which the voltage increasing circuit comprises:

a switching element for repeating an ON/OFF operation and increasing the first voltage according to a duty ratio of the ON/OFF operation; and an oscillator for controlling the ON/OFF operation of the switching element, wherein the operation of the oscillator is stopped under the control of the microcomputer in cases where an AM radio operating signal indicating the operation of the AM radio in the neighborhood of the amplifying unit or the voltage increasing circuit is input to the microcomputer.

8. An amplifying circuit according to claim 6 in which the electric source is a battery used for an on-vehicle type system.

9. An amplifying circuit according to claim 6 in which the selection changing circuit comprises:

a comparator for comparing a reference voltage lower than the first voltage with the level of the amplified signal; and a switching element arranged between the voltage increasing circuit and the amplifying unit for setting to an "on" condition to supply the second voltage to the amplifying unit in cases where the level of the amplified signal is higher than the reference voltage as a result of the comparison performed by the comparator and setting to an "off" condition to supply the first voltage to the amplifying unit in cases where the level of the amplified signal is lower than the reference voltage as a result of the comparison performed by the comparator.

* * * * *